(12) United States Patent
Sung et al.

(10) Patent No.: US 10,008,171 B2
(45) Date of Patent: Jun. 26, 2018

(54) GATE DRIVING CIRCUIT WITH ISOLATING SWITCH FOR DISPLAY DEVICE USING THE SAME

(71) Applicants: Chunghwa Picture Tubes, LTD., Taoyuan (TW); National Chiao Tung University, Hsinchu (TW)

(72) Inventors: Wei-Lien Sung, Taitung County (TW); Han-Lung Liu, Taichung (TW); Wen-Chuan Wang, New Taipei (TW); Chi-Liang Kuo, Taoyuan (TW); Yuan-Hao Chang, New Taipei (TW); Wen-Che Wang, New Taipei (TW); Po-Tsun Liu, Hsinchu (TW); Guang-Ting Zheng, Hsinchu (TW); Yu-Fan Tu, Taoyuan (TW)

(73) Assignees: Chunghwa Picture Tubes, Ltd., Taoyuan (TW); National Chiao Tung University, Hsinchu (TW)

( * ) Notice: Subject to any disclaimer, the term of this patent is extended or adjusted under 35 U.S.C. 154(b) by 0 days. days.

(21) Appl. No.: 15/336,090

(22) Filed: Oct. 27, 2016

(65) Prior Publication Data
US 2018/0061350 A1    Mar. 1, 2018

(30) Foreign Application Priority Data
Aug. 25, 2016 (CN) .......................... 2016 1 0720546

(51) Int. Cl.
G09G 3/36 (2006.01)

(52) U.S. Cl.
CPC ......... *G09G 3/3677* (2013.01); *G09G 3/3688* (2013.01); *G09G 3/3696* (2013.01);
(Continued)

(58) Field of Classification Search
CPC ..................... G09G 3/3611; G09G 2310/0286
(Continued)

(56) References Cited

U.S. PATENT DOCUMENTS 8,018,423 B2    9/2011  Tsai
8,379,790 B2 *  2/2013  Tobita ................... G11C 19/28
                                                          377/64

(Continued)

FOREIGN PATENT DOCUMENTS

TW    I436332    5/2014

*Primary Examiner* — Ram Mistry
(74) *Attorney, Agent, or Firm* — J. C. Patents

(57) ABSTRACT

A gate driving circuit is provided. The gate driving circuit includes multistage driving modules, where an $N^{th}$ stage driving module includes a setting circuit, a first driving circuit, an isolating switch circuit, a second driving circuit and an anti-noise circuit. The setting circuit generates a first precharge signal according to a gate driving signal of an $(N-2)^{th}$ scan line or a start signal. The isolating switch circuit coupled between the first driving circuit and the second driving circuit provides a second precharge signal, so as to effectively avoid a flickering problem of a display image caused by a surge of the gate driving signal due to a coupling effect of a parasitic capacitance of the transistor and a bootstrap capacitor, and meanwhile the bootstrap capacitor is not used, so as to effectively reduce a bezel area.

11 Claims, 7 Drawing Sheets

(52) U.S. Cl.
CPC ............... *G09G 2300/0809* (2013.01); *G09G 2310/0248* (2013.01); *G09G 2320/0247* (2013.01)

(58) Field of Classification Search
USPC .................. 345/55, 98–100; 326/62, 63, 80; 327/333
See application file for complete search history.

(56) References Cited

U.S. PATENT DOCUMENTS

| | | |
|---|---|---|
| 8,542,178 B2 | 9/2013 | Yoo |
| 8,952,945 B2* | 2/2015 | Huang ..................... G09G 3/00 327/109 |
| 2006/0145991 A1* | 7/2006 | Jang ..................... G09G 3/3677 345/94 |
| 2009/0128541 A1* | 5/2009 | Tsai ..................... G09G 3/3677 345/213 |
| 2014/0071104 A1 | 3/2014 | Gao et al. |

* cited by examiner

GATE DRIVING CIRCUIT WITH ISOLATING SWITCH FOR DISPLAY DEVICE USING THE SAME

CROSS-REFERENCE TO RELATED APPLICATION

This application claims the priority benefit of China application serial no. 201610720546.3, filed on Aug. 25, 2016. The entirety of the above-mentioned patent application is hereby incorporated by reference herein and made a part of this specification.

BACKGROUND OF THE INVENTION

Field of the Invention

The invention relates to a driving circuit, and particularly relates to a gate driving circuit.

Description of Related Art

Along with development of technology, related electronic products such as smart phones, tablet personal computers (PCs) are widely used, and demands on display are also gradually increased, for example, image resolution is expected to get higher and higher, and the display is required to have a narrow bezel appearance, etc. In order to satisfy the above demands, in a driving system of a liquid-crystal display (LCD), gate drivers using a gate on array (GOA) technique become a main trend, and a function thereof is to sequentially turn on pixel transistors of each column on an image, such that a data voltage may get into the liquid crystal and storage capacitors. In this way, the liquid crystal may have different angles of deflection under an electric field variation, and in collaboration with a backlight plate and a filter, the image of the display panel is constructed. In recent years, in consumable products, a part of the gate drivers is highly integrated with a lower layer glass substrate other than being attached to the panel surrounding by using conventional IC chips. Although electron mobility of a-Si thin-film transistors (TFTs) is low, the high uniformity and low cost thereof are advantages for implementing the gate drivers.

In the existing techniques, a bootstrap capacitor or a diode device can be configured between a gate and a source of a transistor in charge of driving a scan line, so as to completely output a driving voltage signal of a high level, though according to such manner, the driving voltage signal is liable to have a surge due to a coupling effect of a parasitic capacitance of the transistor and the bootstrap capacitor, which may result in a flickering problem of a display image. Moreover, usage of the bootstrap capacitor is an obstacle for achieving the demand of a narrow bezel.

SUMMARY OF THE INVENTION

The invention is directed to a gate driving circuit, which is adapted to effectively avoid a flickering problem and greatly decrease a bezel area.

The invention provides a gate driving circuit including multistage driving modules, where an $N^{th}$ stage driving module drives an $N^{th}$ scan line and an $(N+2)^{th}$ scan line of a display panel, where N is a positive integer. The $N^{th}$ stage driving module includes a setting circuit, a first driving circuit, an isolating switch circuit, a second driving circuit and an anti-noise circuit. The setting circuit generates a first precharge signal according to a gate driving signal of an $(N-2)^{th}$ scan line or a start signal. The first driving circuit is coupled to the setting circuit, and generates a gate driving signal of the $N^{th}$ scan line according to the first precharge signal. The isolating switch circuit is coupled to the first driving circuit and a power voltage, and is turned on under control of the gate driving signal of the $N^{th}$ scan line, and outputs the power voltage to serve as a second precharge signal. The second driving circuit is coupled to the isolating switch circuit, and generates a gate driving signal of the $(N+2)^{th}$ scan line according to the second precharge signal. The anti-noise circuit is coupled to the setting circuit, the isolating switch circuit, the first driving circuit and the second driving circuit, and respectively maintains the first precharge signal, the second precharge signal, the gate driving signal of the $N^{th}$ scan line, and the gate driving signal of the $(N+2)^{th}$ scan line to an anti-noise voltage according to a first period signal and a second period signal during a period when the first driving circuit and the second driving circuit stop driving the corresponding scan lines.

In an embodiment of the invention, the anti-noise circuit includes a first pull-down circuit, a first anti-noise start circuit, a second pull-down circuit and a second anti-noise start circuit. The first pull-down circuit is coupled to the setting circuit, the first driving circuit, the isolating switch circuit and the second driving circuit. The first anti-noise start circuit is coupled to the first pull-down circuit, and determines whether to start the first pull-down circuit according to the first period signal. The second pull-down circuit is coupled to the setting circuit, the first driving circuit, the isolating switch circuit and the second driving circuit. The second anti-noise start circuit is coupled to the second pull-down circuit, and determines whether to start the second pull-down circuit according to the second period signal, where the first pull-down circuit and the second pull-down circuit are respectively controlled by the first anti-noise start circuit and the second anti-noise start circuit, and are started in turns to pull down the first precharge signal, the second precharge signal, the gate driving signal of the $N^{th}$ scan line and the gate driving signal of the $(N+2)^{th}$ scan line to the anti-noise voltage.

In an embodiment of the invention, the first period signal and the second period signal are inverted signals.

In an embodiment of the invention, the first period signal and the second period signal are frequency signals, and a period of the first period signal and the second period signal is equal to 0.5 frame time.

In an embodiment of the invention, the anti-noise circuit further includes a control circuit, where the control circuit is coupled to the setting circuit, and disables the anti-noise circuit according to the first precharge signal.

In an embodiment of the invention, the $N^{th}$ driving module further includes a reset circuit, where the reset circuit is coupled to the anti-noise circuit and the first driving circuit, and generates a discharge control signal according to a gate driving signal of an $(N+6)^{th}$ scan line, and the control circuit enables the anti-noise circuit according to the discharge control signal.

In an embodiment of the invention, the first anti-noise start circuit and the second anti-noise start circuit respectively include a first transistor and a second transistor. A drain and a gate of the first transistor are coupled to each other, and the drain of the first transistor receives the corresponding period signal, and a source of the first transistor is coupled to the corresponding pull-down circuit. A drain and a source of the second transistor are respectively coupled to the corresponding pull-down circuit and the anti-noise voltage, and a gate of the second transistor receives the corresponding period signal.

In an embodiment of the invention, the first pull-down circuit and the second pull-down circuit respectively include a third transistor to a sixth transistor. The third transistor is coupled between the setting circuit and the anti-noise voltage, and a gate of the third transistor is coupled to the control circuit and the corresponding anti-noise start circuit. The fourth transistor is coupled between the first driving circuit and the anti-noise voltage, and a gate of the fourth transistor is coupled to the control circuit and the corresponding anti-noise start circuit. The fifth transistor is coupled between the isolating switch circuit and the anti-noise voltage, and a gate of the fifth transistor is coupled to the control circuit and the corresponding anti-noise start circuit. The sixth transistor is coupled between the second driving circuit and the anti-noise voltage, and a gate of the sixth transistor is coupled to the control circuit and the corresponding anti-noise start circuit, where the third transistor to the sixth transistor are respectively controlled by the control circuit, and the corresponding anti-noise start circuit pulls down the first precharge signal, the second precharge signal, the gate driving signal of the $N^{th}$ scan line and the gate driving signal of the $(N+2)^{th}$ scan line to the anti-noise voltage.

In an embodiment of the invention, the control circuit includes a seventh transistor and an eighth transistor. A drain and a source of the seventh transistor are respectively coupled between the first pull-down circuit and the anti-noise voltage, and a gate of the seventh transistor is coupled to the setting circuit. A drain and a source of the eighth transistor are respectively coupled between the second pull-down circuit and the anti-noise voltage, and a gate of the eighth transistor is coupled to the reset circuit, the first transistor and the second transistor are turned on under control of the first precharge signal, and are turned off under control of the discharge control signal.

In an embodiment of the invention, the first driving circuit includes a first transistor, where a drain thereof receives a first frequency signal, a source of first the transistor is coupled to the first pull-down circuit and the second pull-down circuit, and a gate of the first transistor is coupled to the setting circuit and the reset circuit, and the first transistor is turned on under control of the first precharge signal, and is turned off under control of the discharge control signal.

In an embodiment of the invention, the isolating switch circuit includes a second transistor, where a drain thereof is coupled to the power voltage, a source of the first transistor is coupled to the first pull-down circuit and the second pull-down circuit, and a gate of the second transistor is coupled to the source of the first transistor.

In an embodiment of the invention, the second driving circuit includes a third transistor, where a drain thereof receives a second frequency signal, a source thereof is coupled to the first pull-down circuit and the second pull-down circuit, and a gate thereof is coupled to the source of the second transistor.

In an embodiment of the invention, a phase difference of the first frequency signal and the second frequency signal is ¼ period.

According to the above description, in the embodiment of the invention, the isolating switch circuit configured between the first driving circuit and the second driving circuit is used to provide the second precharge signal, so as to effectively avoid a flickering problem of a display image caused by a surge of the gate driving signal due to a coupling effect of a parasitic capacitance of the transistor and a bootstrap capacitor, and since the bootstrap capacitor is not used, a bezel area is effectively reduced. Moreover, the anti-noise circuit may respectively maintain the first precharge signal, the second precharge signal, the gate driving signal of the $N^{th}$ scan line and the gate driving signal of the $(N+2)^{th}$ scan line to the anti-noise voltage according to the first period signal and the second period signal during a period when the first driving circuit and the second driving circuit stop driving the corresponding scan lines, so as to avoid voltage instability of output terminals of the gate driving signals due to a floating state thereof.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
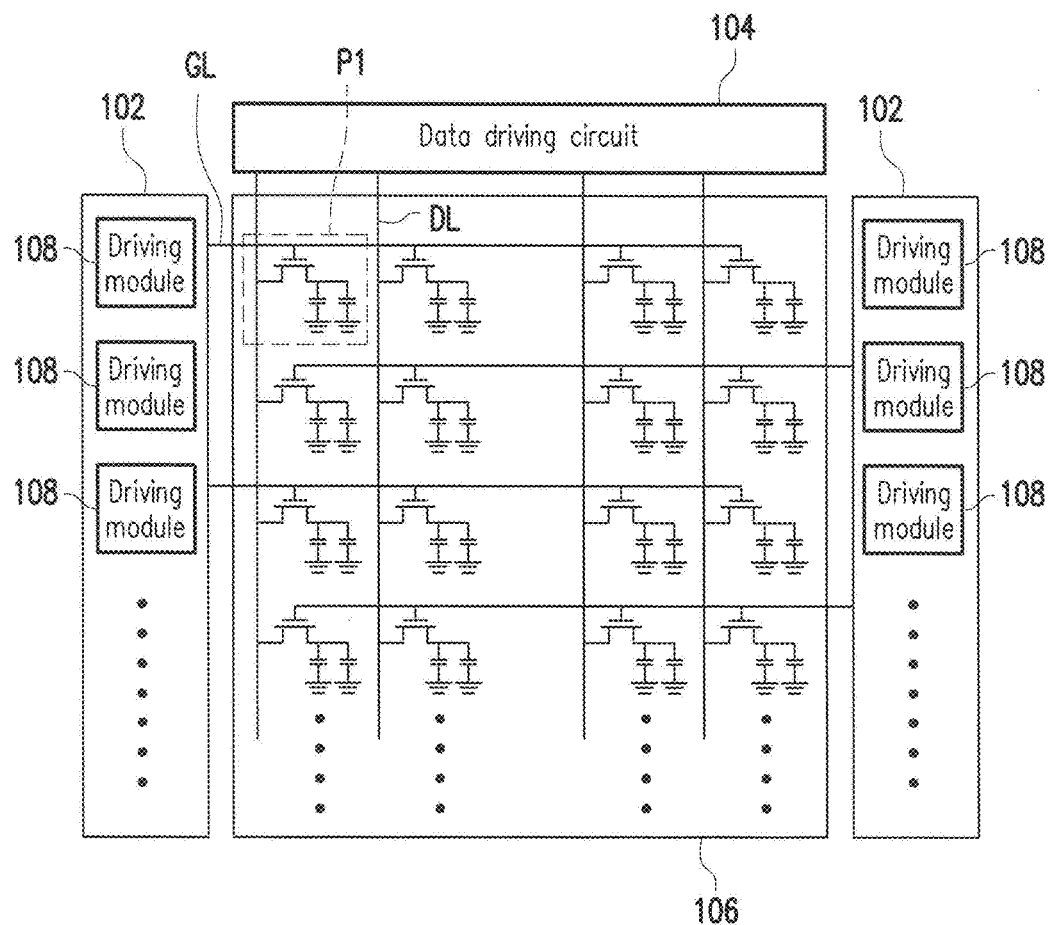
FIG. 1 is a schematic diagram of a display device according to an embodiment of the invention.

FIG. 1 is a schematic diagram of a display device according to an embodiment of the invention. Referring to FIG. 1, the display device includes a gate driving circuit 102, a data driving circuit 104 and a display panel 106, where the gate driving circuit 102 includes multistage driving modules 108. The display panel 106 includes a plurality of pixel structures P1, as shown in FIG. 1, each of the pixel structures P1 includes a transistor and a pixel capacitor and a storage capacitor coupled to the transistor. The display panel 106 includes a plurality of scan lines GL and a plurality of data lines DL. The driving modules 108 of the gate driving circuit 102 are respectively coupled to the corresponding pixel structures P1 through the scan lines GL, and the data driving circuit 104 is coupled to the corresponding pixel structures through the data lines DL. In the present embodiment, the gate driving circuit 102 are separately disposed at two sides of the display panel 106, where the driving modules 108 of odd stages (the first, third, fifth, . . . , stages) are disposed at a left side of the display panel 106, and the driving modules 108 of even stages (the second, fourth, sixth, . . . , stages) are disposed at a right side of the display panel 106, though the invention is not limited thereto, and in some embodiments, the gate driving circuit 102 can also be integrated to one side of the display panel 106. Moreover, in the embodiment of FIG. 1, the driving modules 108 located at the left side of the display panel 106 are configured to drive the odd scan lines GL, and the driving modules 108 located at the right side of the display panel 106 are configured to drive the even scan lines GL, and each of the driving modules 108 is a single-stage double output structure, for example, regarding the left side of the display panel 106, the $1^{st}$ stage driving module 108 is coupled to the $1^{st}$ and $3^{rd}$ scan lines GL to drive the $1^{st}$ and $3^{rd}$ scan lines GL, the $3^{rd}$ stage driving module 108 is coupled to the $5^{th}$ and $7^{th}$ scan lines to drive the $5^{th}$ and $7^{th}$ scan lines . . . , and the others are deuced by analogy. Moreover, regarding the right side of the display panel 106, the $2^{nd}$ stage driving module 108 is coupled to the $2^{nd}$ and $4^{th}$ scan lines GL to drive the $2^{nd}$ and $4^{th}$ scan lines GL, the $4^{th}$ stage driving module 108 is coupled to the $6^{th}$ and $8^{th}$ scan lines to drive the $6^{th}$ and $8^{th}$ scan lines . . . , and the others are deuced by analogy. Moreover, the data driving circuit 104 may provide a data voltage to the corresponding pixel structures P1 during a driving period of the scan lines GL, such that the pixel structures P1 may display an image corresponding to the data voltage. By the means of bilateral scanning, the driving modules 108 of the gate driving circuit 102 can be evenly distributed at the two sides of the display panel 106, so as to reduce a risk of that the signal output by the gate driving circuit 102 cannot drive the subsequent stages due to signal attenuation.

Figure 2:
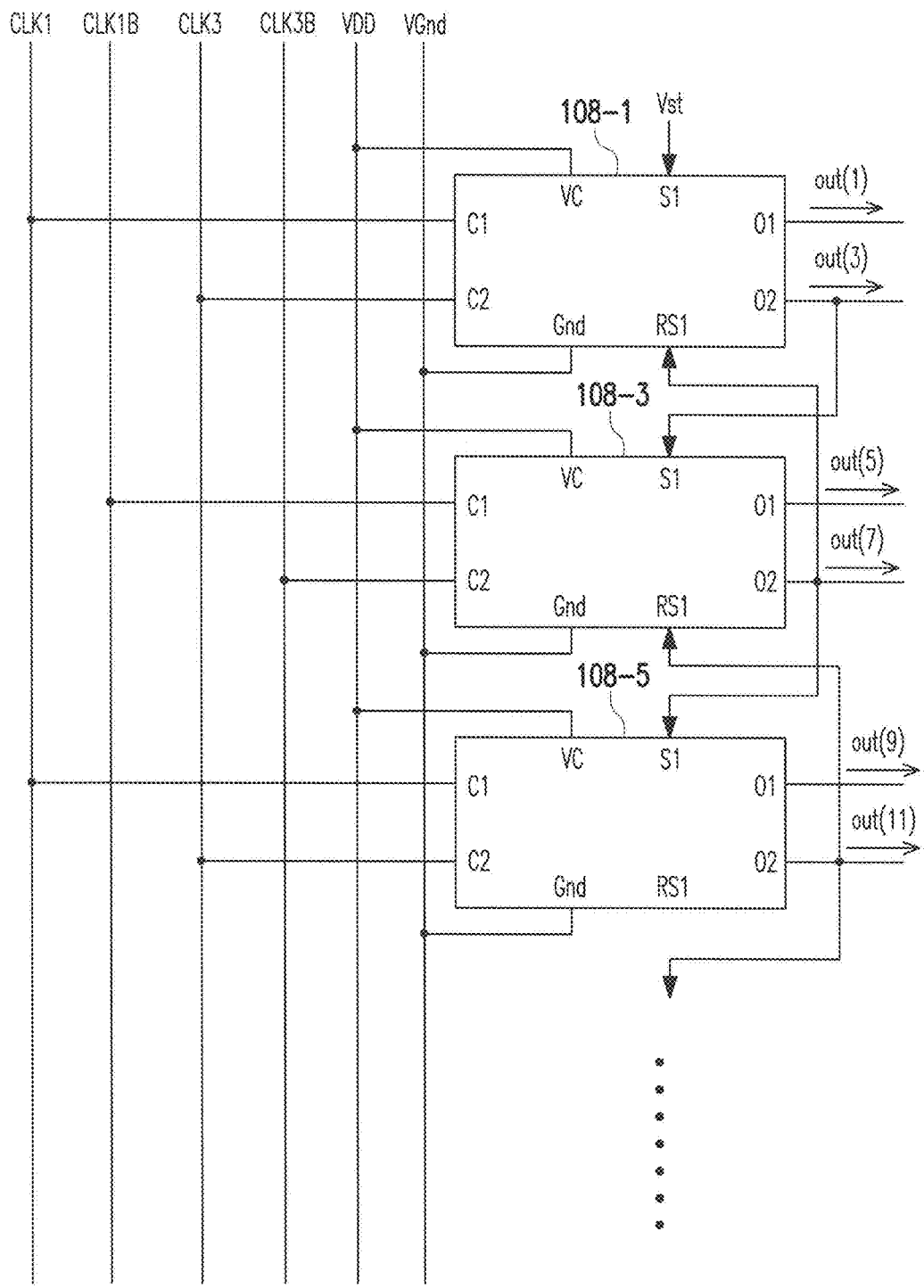
FIG. 2 is a schematic diagram of a gate driving circuit according to an embodiment of the invention.

FIG. 2 is a schematic diagram of a gate driving circuit according to an embodiment of the invention. Referring to FIG. 2, taking the gate driving circuit 102 located at the left side of the display panel 106 as an example, the gate driving circuit 102 includes odd stage driving modules 108-1, 108-3, 108-5, . . . , where each of the driving modules has a power input terminal VC, a ground terminal Gnd, a frequency input terminal C1, a frequency input terminal C2, a setting terminal S1, a reset terminal RS1 and an output terminal O1, an output terminal O2. The power input terminal VC is used for receiving a power voltage VDD, the ground terminal Gnd is used for connecting a ground voltage VGnd, and each of the driving modules respectively receive a corresponding frequency signal through the frequency input terminal C1 and the frequency input terminal C2, for example, the driving module 108-1 receives a frequency signal CLK1 and a frequency signal CLK3, the driving module 108-3 receives a frequency signal CLK1B and a frequency signal CLK3B, and the driving module 108-5 receives the frequency signal CLK1 and the frequency signal CLK3, . . . , and the others are deduced by analogy. The frequency signal CLK1B and the frequency signal CLK3B are respectively inverted signals of the frequency signal CLK1 and the frequency signal CLK3. Moreover, the setting terminal S1 of the $N^{th}$ stage driving module is used for receiving a gate driving signal out(n) of the $N^{th}$ scan line GL, for example, the setting terminal S1 of the driving module 108-3 receives a gate driving signal out(3) of the $3^{rd}$ scan line GL. It should be noted that the setting terminal S1 of the $1^{st}$ stage driving module 108-1 is used for receiving a start signal Vst. Moreover, the reset terminal RS1 of the $N^{th}$ stage driving module is used for receiving a gate driving signal out(n+6) of the $(N+6)^{th}$ scan line GL, for example, the reset terminal RS1 of the driving module 108-1 receives a gate driving signal out(7) of the $7^{th}$ scan line GL. The output terminal O1 and the output terminal O2 of the $N^{th}$ stage driving module is used for outputting the gate driving signal out(n) and the gate driving signal out(n+2) of the $N^{th}$ and the $(N+2)^{th}$ scan lines GL on the display panel 106, so as to drive the gates of the transistors in the pixel structures P1 connected to the $N^{th}$ and the $(N+2)^{th}$ scan lines GL. For example, the output terminal O1 and the output terminal O2 of the $1^{st}$ stage driving module 108-1 output the gate driving signal out(1) and the gate driving signal out(3) of the $1^{st}$ and the $3^{rd}$ scan lines GL.

Similarly, the even stage driving modules in the gate driving circuit 102 located at the right side of the display panel 106 are also implemented in the way similar to that of the embodiment of FIG. 2, and those skilled in the art can deduce the implementation according to the description of the embodiment of FIG. 2, and details thereof are not repeated. Implementation of the driving modules in the gate driving circuit 102 located at the left side of the display panel 106 is further described below, and those skilled in the art may deduce the implementation of the driving modules in the gate driving circuit 102 located at the right side of the display panel 106 according to the following description, so that the implementation of the driving modules in the gate driving circuit 102 located at the right side of the display panel 106 is not further described.

Figure 3:
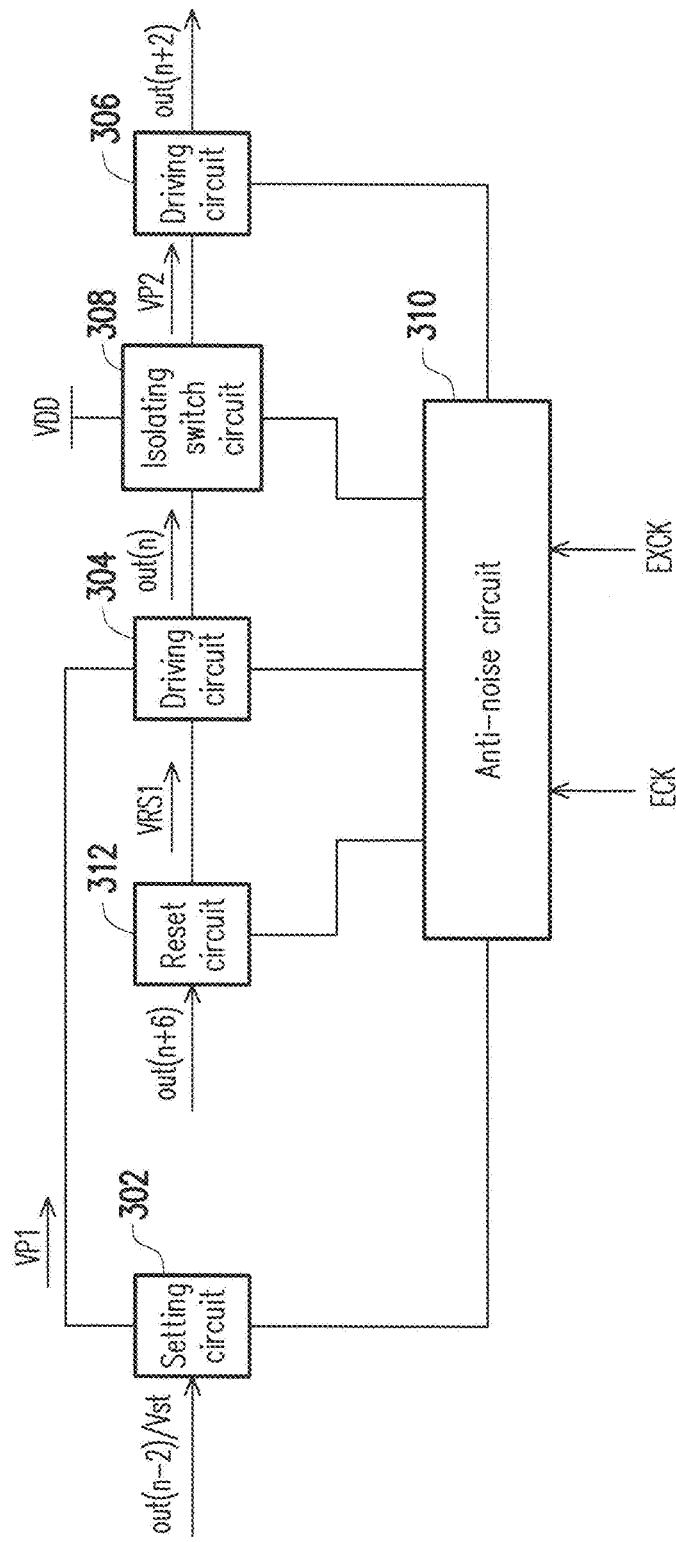
FIG. 3 is a schematic diagram of an $N^{th}$ stage driving module according to an embodiment of the invention.

FIG. 3 is a schematic diagram of the $N^{th}$ stage driving module according to an embodiment of the invention. Referring to FIG. 3, in detail, the $N^{th}$ driving module may include a setting circuit 302, a driving circuit 304, a driving circuit 306, an isolating switch circuit 308, an anti-noise circuit 310 and a reset circuit 312, where the anti-noise circuit 310 is coupled to the setting circuit 302, the driving circuit 304, the driving circuit 306, the isolating switch circuit 308 and the reset circuit 312. The driving circuit 304 is further coupled to the setting circuit 302, the reset circuit 312 and the isolating switch circuit 308, and the isolating switch circuit 308 is further coupled to the driving circuit 306. The setting circuit 302 generates a precharge signal VP1 according to a gate driving signal out(n–2) of an $(N–2)^{th}$ scan line GL or a start signal Vst (when the driving module is the $1^{st}$ stage or the $2^{nd}$ stage driving module, the setting circuit 302 generates the precharge signal VP1 according to the start signal Vst). The driving circuit 304 generates a gate driving signal out(n) of the $N^{th}$ scan line GL according to the precharge signal VP1. The isolating switch circuit 308 is turned on under control of the gate driving signal out(n) of the $N^{th}$ scan line GL, and outputs the power voltage VDD to serve as a precharge signal VP2. The driving circuit 306 generates a gate driving signal out(n+2) of the $(N+2)^{th}$ scan line GL according to the second precharge signal VP2. In this way, the isolating switch circuit 308 configured between the driving circuit 304 and the driving circuit 306 is used to provide the precharge signal VP2, so as to effectively avoid a flickering problem of a display image caused by a voltage surge of the gate driving signal out(n) and the gate driving circuit out(n–2) due to that the gate driving signal out(n) and the gate driving circuit out(n–2) are influenced by the frequency signal received by the driving transistor through a parasitic capacitance and a bootstrap capacitor (or a diode device) in case that the prior art adopts the bootstrap capacitor or the diode device.

Moreover, the reset circuit 312 may generate a discharge control signal VRS1 according to the gate driving signal out(n+6) of the $(N+6)^{th}$ scan line, so as to enable the anti-noise circuit 310 during the period when the driving circuit 304 and the driving circuit 306 stop driving the corresponding scan lines GL. The anti-noise circuit 310 may maintain the precharge signal VP1, the precharge signal VP2, the gate driving signal out(n) of the $N^{th}$ scan line GL, and the gate driving signal out(n+2) of the $(N+2)^{th}$ scan line GL to an anti-noise voltage (for example, a ground voltage, though the invention is not limited thereto) according to a period signal ECK and a period signal EXCK during the period when the driving circuit 304 and the driving circuit 306 stop driving the corresponding scan lines GL, so as to avoid voltage instability of the output terminals of the gate driving signal out(n) and the gate driving signal out(n+2) due to that the output terminals are in a floating state. The period signal ECK and the period signal EXCK are, for example, inverted signals, and the anti-noise circuit 310 operates according to the period signal ECK and the period signal EXCK, such that circuit devices of the anti-noise circuit 310 are avoided to be biased to a specific voltage level for a long time to cause reliability reduction of the circuit devices to influence the anti-noise capability of the anti-noise circuit 310.

Figure 4:
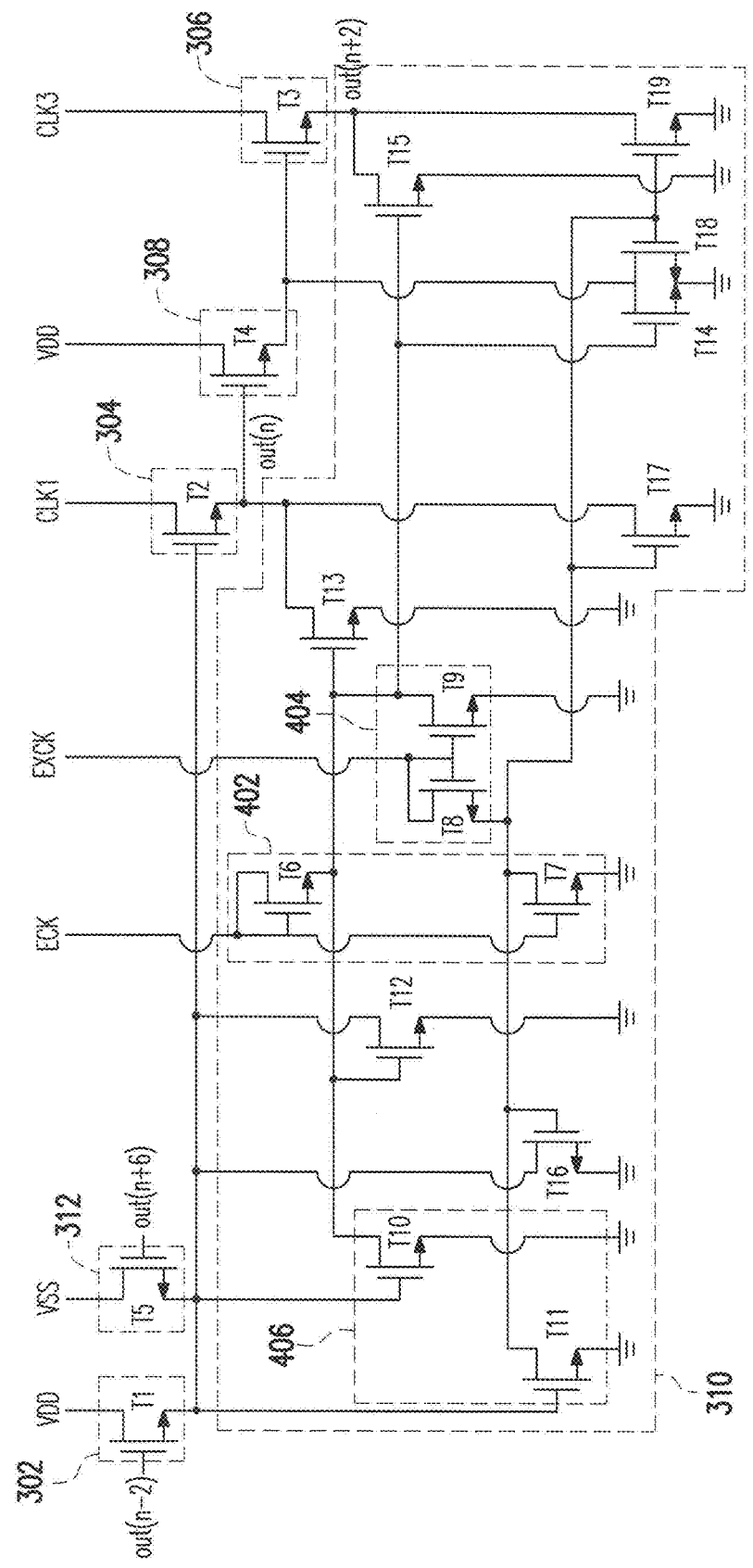
FIG. 4 is a schematic diagram of an $N^{th}$ stage driving module according to another embodiment of the invention.

FIG. 4 is a schematic diagram of the $N^{th}$ stage driving module according to another embodiment of the invention. Referring to FIG. 4, in detail, the $N^{th}$ stage driving module can be implemented as shown in FIG. 4. In the present embodiment, a setting circuit 302, a driving circuit 304, a driving circuit 306, an isolating switch circuit 308 and a reset circuit 312 are respectively implemented by a transistor T1, a transistor T2, a transistor T3, a transistor T4, a transistor T5. A drain of the transistor T1 is coupled to the power voltage VDD, a source of the transistor T1 is coupled to a gate of the transistor T2 and the anti-noise circuit 310, and a gate of the transistor T1 receives the gate driving signal out(n−2) of the $(N-2)^{th}$ scan line GL or the start signal Vst (when the driving module is the $1^{st}$ stage or the $2^{nd}$ stage driving module, the gate of the transistor receives the start signal Vst). A drain of the transistor T2 receives a frequency signal CLK1, and a source of the transistor T2 is coupled to a gate of the transistor T4 and the anti-noise circuit 310. A drain of the transistor T4 is coupled to the power voltage VDD, and a source of the transistor T4 is coupled to a gate of the transistor T3 and the anti-noise transistor 310. A drain of the transistor T3 receives a frequency signal CLK3, and a source of the transistor T3 is coupled to the anti-noise circuit 310, where a phase difference of the frequency signal CLK1 and the frequency signal CLK3 is ¼ period, though the invention is not limited thereto, and by using the frequency signal overlapped on a time domain as a control signal of the driving module of each stage, the gate driving signals with waveforms overlapped on the time domain can be generated, so as to provide a function of pre-driving the pixel structures P1 to resolve a problem of insufficient charging of a liquid crystal capacitor due to that a driving time of the scan line GL is shortened under a high resolution. A drain of the transistor T5 is coupled to the power voltage VSS, the power voltage VSS is a low level voltage smaller than the power voltage VDD, for example, the ground voltage, though the invention is not limited thereto. A source of the transistor T5 is coupled to the gate of the transistor T2 and the anti-noise circuit 310, and a gate of the transistor T5 receives the gate driving signal out(n+6) of the $(N+6)^{th}$ scan line GL.

Moreover, the anti-noise circuit 310 of the present embodiment includes transistors T6-T19, where the transistor T6 and the transistor T7 construct an anti-noise start circuit 402, the transistor T8 and the transistor T9 construct an anti-noise start circuit 404, the transistor T10 and the transistor T11 construct a control circuit 406, the transistors T12-T15 construct a first pull-down circuit, and the transistors T16-T19 construct a second pull-down circuit. The first pull-down circuit is coupled to the anti-noise start circuit 402, the setting circuit 302, the driving circuit 306 and the isolating switch circuit 308, and the second pull-down circuit is coupled to the anti-noise start circuit 404, the setting circuit 302, the driving circuit 306 and the isolating switch circuit 308. The anti-noise start circuit 402 may determine whether to start the first pull-down circuit according to the period signal ECK, and the anti-noise start circuit 404 may determine whether to start the second pull-down circuit according to the period signal EXCK, where the period signal ECK and the period signal EXCK are, for example, frequency signals with a long period, and the period signal ECK and the period signal EXCK are inverted signals, and a period thereof is, for example, equal to 0.5 frame time, though the invention is not limited thereto. The first pull-down circuit and the second pull-down circuit are respectively controlled by the anti-noise start circuit 402 and the anti-noise start circuit 404 to start in alternation, and pull down the precharge signal VP1, the precharge signal VP2, the gate driving signal out(n) of the $N^{th}$ scan line and the gate driving signal out(n+2) of the $(N+2)^{th}$ scan line to the anti-noise voltage (for example, the ground voltage, though the invention is not limited thereto), so as to stabilize the voltage of the gate driving signals out(n) and out(n+2) during the period when the driving circuit 304 and the driving circuit 306 stop driving the corresponding scan lines. The control circuit 406 is coupled to the setting circuit 302 and the reset circuit 304, and may disable the anti-noise circuit 310 according to the precharge signal VP1, and enable the anti-noise circuit 310 according to the discharge control signal VRS1 generated by the reset circuit 312.

Further, in the anti-noise start circuit 402, a drain and a gate of the transistor T6 are coupled to each other, the drain of the transistor T6 receives the period signal ECK, and a source of the transistor T6 is coupled to drains of the transistor T11, the transistor T9 and the transistor T10 and gates of the transistor T12 and the transistor T13. A drain of the transistor T7 is coupled to a source of the transistor T8 and the drain of the transistor T11, a source of the transistor T7 is coupled to the ground, and a gate of the transistor T7 is coupled to the gate of the transistor T6. In the anti-noise start circuit 404, a drain and a gate of the transistor T8 are coupled to each other, the drain of the transistor T8 receives the period signal EXCK, and the source of the transistor T8 is coupled to the drains of the transistor T11 and the transistor T7 and the gates of the transistor T16, the transistor T17, the transistor T18 and the transistor T19. A drain of the transistor T9 is coupled to the source of the transistor T6 and the drain of the transistor T10, a source of the transistor T9 is coupled to the ground, and a gate of the transistor T9 is coupled to the gate of the transistor T8. In the control circuit 406, a gate of the transistor T10 is coupled to the sources of the transistor T1 and the transistor T5, a source of the transistor T10 is coupled to the ground, and a drain of the transistor T10 is coupled to the gates of the transistor T12, the transistor T13, the transistor T14 and the transistor T15. A gate of the transistor T11 is coupled to the sources of the transistor T1 and the transistor T5, a source of the transistor T11 is coupled to the ground, and a drain of the transistor T11 is coupled to the gates of the transistor T16, the transistor T17, the transistor T18 and the transistor T19. Moreover, the drains of the transistor T12 and the transistor T16 are coupled to the sources of the transistor T1 and the transistor T5, the sources of the transistor T12 and the transistor T16 are coupled to the ground, the drains of the transistor T13 and the transistor T17 are coupled to the source of the transistor T2, the sources of the transistor T13 and the transistor T17 are coupled to the ground, the drains of the transistor T14 and the transistor T18 are coupled to the source of the transistor T4, the sources of the transistor T14 and the transistor T18 are coupled to the ground, the drains of the transistor T15 and the transistor T19 are coupled to the source of the transistor T3, and the sources of the transistor T15 and the transistor T19 are coupled to the ground.

Figure 5:
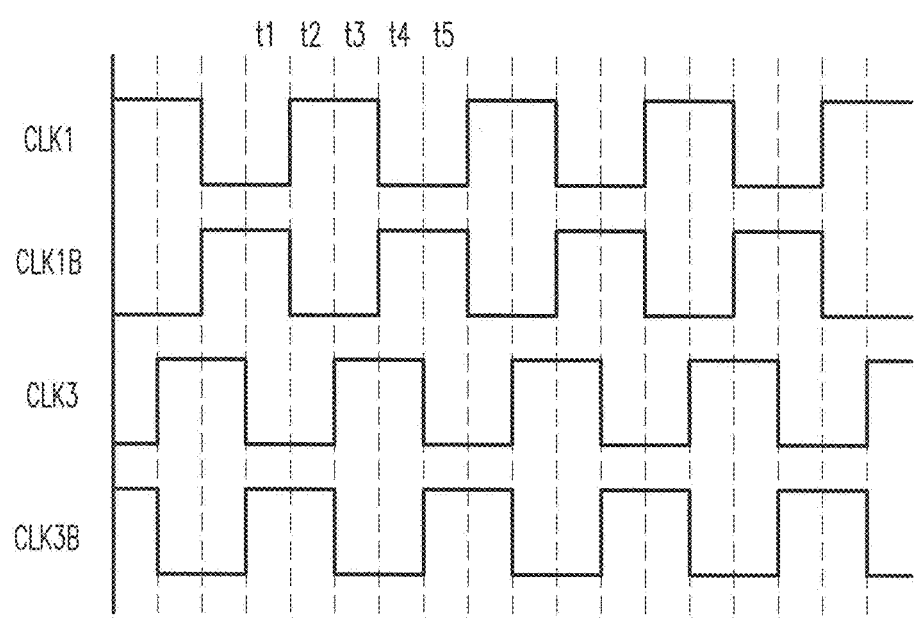
FIG. 5 is a waveform schematic diagram of frequency signals according to an embodiment of the invention.
Figure 6:
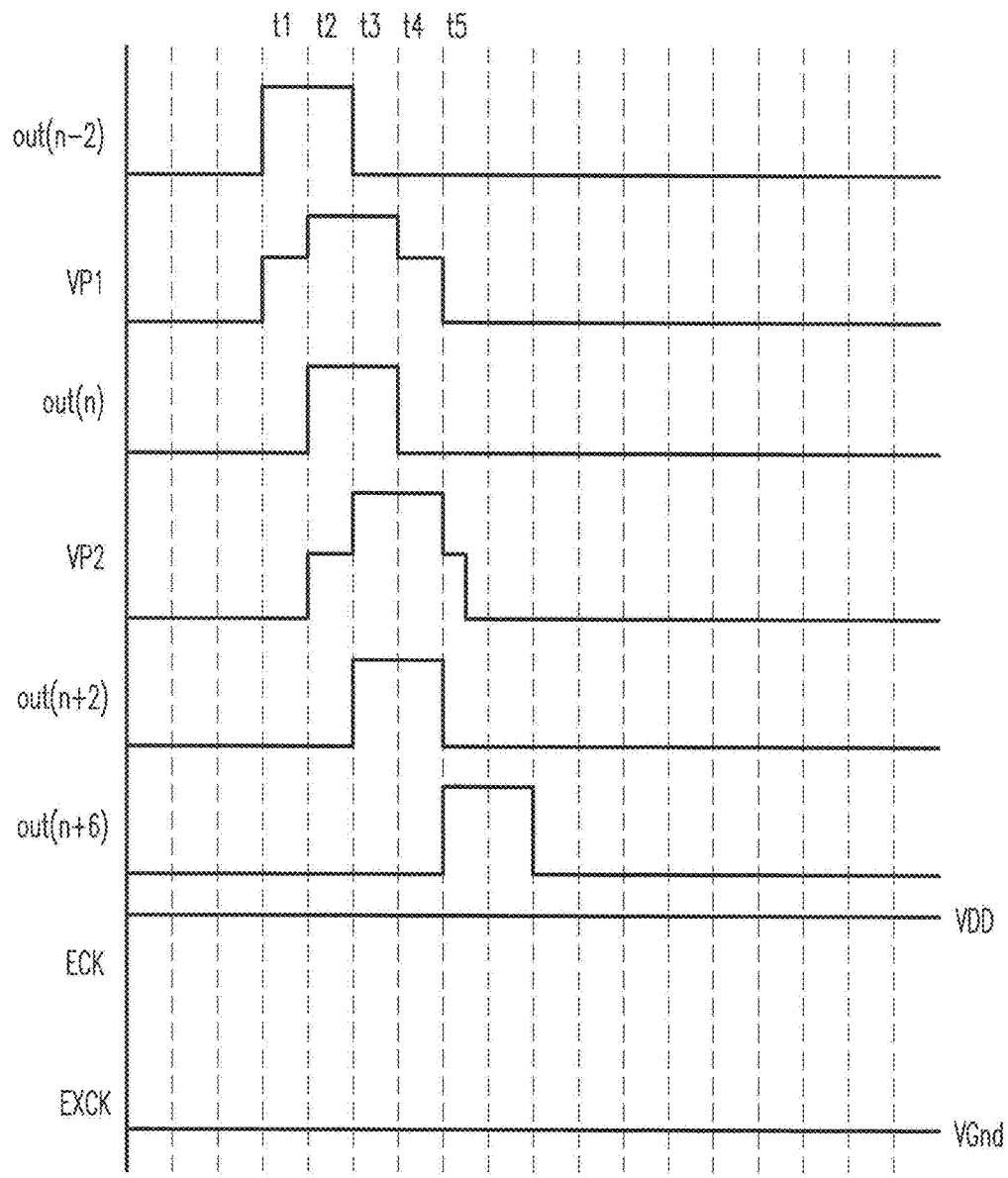
FIG. 6 is a waveform schematic diagram of gate driving signals, precharge signals and period signals according to an embodiment of the invention.

FIG. 5 is a waveform schematic diagram of the frequency signals according to an embodiment of the invention, and FIG. 6 is a waveform schematic diagram of the gate driving signals, the precharge signals and the period signals according to an embodiment of the invention. A circuit operation of the embodiment of FIG. 4 is described below with reference of FIG. 5 and FIG. 6. Referring to FIG. 4 to FIG. 6, in a time interval t1, the gate driving signal out(n−2) (in case of the $1^{st}$ stage driving module, the gate driving signal out(n−2) is replaced by the start signal Vst) turns on the transistor T1 to produce the precharge signal VP1 at the source of the transistor T1 to charge the gate of the transistor T2, so as to turn on the transistor T2. Now, the frequency signal CLK1 is in a low voltage level, and the frequency signal CLK1 pulls down the gate driving signal out(n) to the low voltage level through the turned on transistor T2. On the other hand, the transistor T10 and the transistor T11 are also turned on by the precharge signal VP1, such that the anti-noise circuit 310 is in a disable state.

Figure 7:
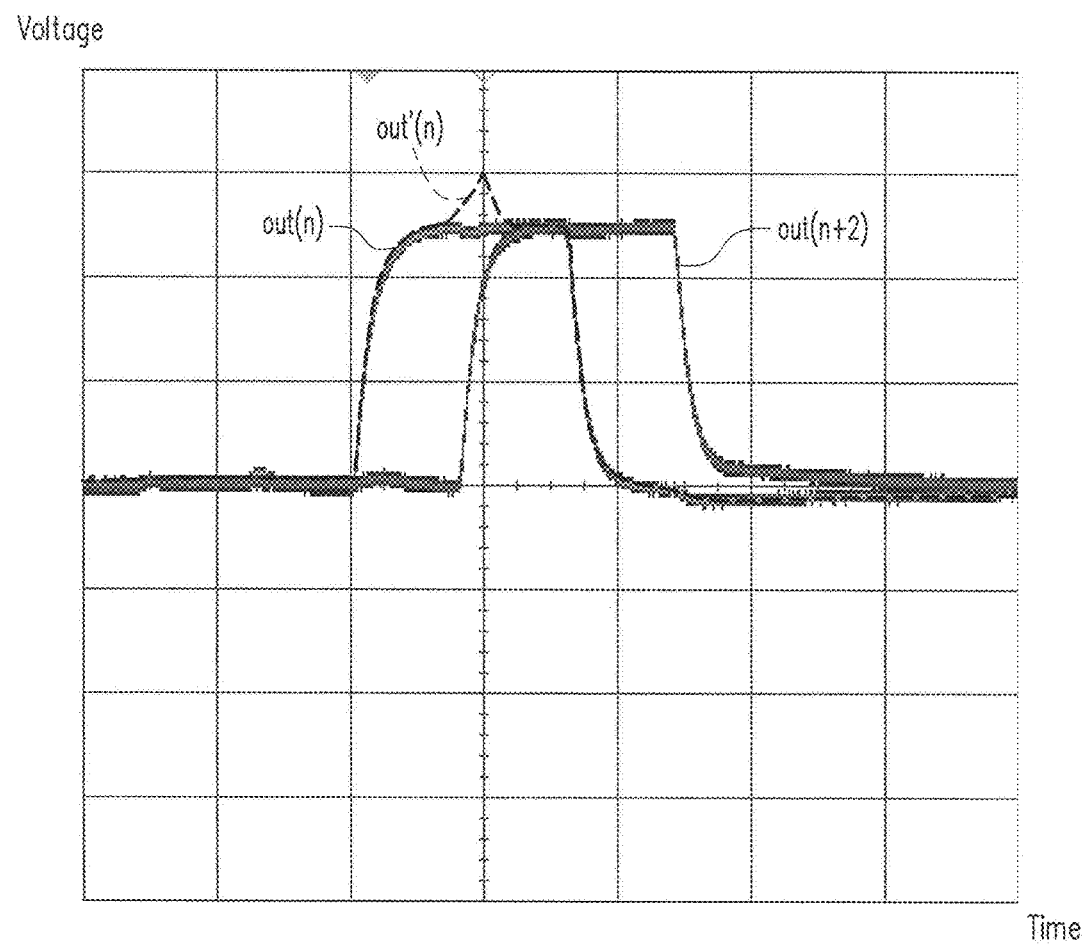
FIG. 7 is a schematic diagram of measured waveforms of the gate driving signals.

In a time interval t2, the frequency signal CLK1 is changed from the low voltage level to the high voltage level, and the gate driving signal out(n) generated by the transistor T2 starts to charge the gate of the transistor T4, and meanwhile a parasitic capacitance of the transistor T2 produces a bootstrap effect to the gate of the transistor T2 to elevate the gate of the transistor T2 to a higher voltage level, such that the frequency signal CLK1 more completely serves as the gate driving signal out(n) for outputting. Besides that the gate driving signal out(n) drives the $N^{th}$ scan line GL, the gate driving signal out(n) also turns on the transistor T4 and charges the gate of the transistor T3, and now the frequency signal CLK3 has the low voltage level, and the frequency signal CLK3 pulls down the gate driving signal out(n+2) to the low voltage level through the turned on transistor T3. The transistor T4 may isolate the transistor T2 and the transistor T3 serving as the driving circuits, so as to avoid mutual influence of the operations of the transistor T2 and the transistor T3, and effectively generate the gate driving signal out(n) and the gate driving signal out(n+2) with correct voltage values. As shown in a schematic diagram of measured waveforms of the gate driving signals of FIG. 7, a dot line part shows the gate driving signal out'(n) generated according to the existing technique (i.e. a bootstrap capacitor or a diode device is used between the two driving transistors (the transistor T2 and the transistor T3)), and when the gate driving signal out(n+2) is changed to the high voltage level, it may influence the output of the gate driving signal out'(n) through the bootstrap capacitor or the diode device, such that the gate driving signal out'(n) may have a surge. Comparatively, by using the implementation of the present embodiment (i.e. the transistor T4 is used between two driving transistors (the transistor T2 and the transistor T3) to isolate the transistor T2 and the transistor T3 serving as the driving circuits, the gate driving signal is avoided to have a surge (shown as the gate driving signal out(n) of FIG. 7).

In a time interval t3, the transistor T3 is turned on by the precharge signal VP2, and the frequency signal CLK3 is changed from the low voltage level to the high voltage level, so that the gate driving signal out(n+2) is also changed to the high voltage level, and meanwhile the gate driving signal out(n+2) produces the bootstrap effect to the gate of the transistor T3 through the parasitic capacitance of the transistor T3, and the gate of the transistor T3 is elevated to a higher voltage level, such that the frequency signal CLK3 more completely serves as the gate driving signal out(n+2) for outputting. Besides that the gate driving signal out(n+2) drives the $(N+2)^{th}$ scan line GL, the gate driving signal out(n+2) also serves as a start signal of a next stage driving module. In this way, by using the parasitic capacitance provided by the large-size driving transistor to produce the bootstrap effect, the high level of the frequency signal is output to the scan line GL, so as to avoid additionally setting a bootstrap capacitor to achieve an effect of reducing a bezel area.

In a time interval t4, output of the gate driving signal out(n+2) is completed, and the gate driving signal out(n+2) is changed to the low voltage level when the time interval t4 is ended.

In a time interval t5, the transistor T5 is turned on under control of the gate driving signal out(n+6), and the source thereof generates the discharge control signal VRS1 according to the power voltage VSS to pull down the gate voltage of the transistor T2 to a low voltage level, such that the transistor T2 and the transistor T10, the transistor T11 in the control circuit 406 are turned off to enable the anti-noise circuit 310, and the first pull-down circuit or the second pull-down circuit may pull down the precharge signal VP1, the precharge signal VP2 and the gate driving signals out(n) and out(n+2) to the anti-noise voltage (which is the ground voltage in the present embodiment), so as to ensure that the gates of the transistor T2, the transistor T4, the transistor T3 and the source of the transistor T3 are not in the floating state during the period when the driving circuit 304 and the driving circuit 306 stop driving the scan line GL.

Further, when the anti-noise circuit 310 is enabled, the source of the transistor T5 has a low voltage level, such that the transistor T10, the transistor T11, the transistor T12 and the transistor T16 are turned off. In the present embodiment, since a voltage value of the period signal ECK is the power voltage VDD, and a voltage value of the period signal is the ground voltage VGnd, the transistors T6-T7 and T12-T15 are turned on, and the transistors T8-T9 and T16-T19 are turned off. Namely, the anti-noise start circuit 402 starts the first pull-down circuit (the transistors T12-T15) according to the period signal ECK to pull down the precharge signal VP1, the precharge signal VP2 and the gate driving signals out(n) and out(n+2) to the anti-noise voltage (the ground voltage), and the anti-noise start circuit 404 turns off the first pull-down circuit (the transistors T16-T19) according to the period signal EXCK. Similarly, when the voltage value of the period signal ECK is changed to the ground voltage VGnd, and the voltage value of the period signal EXCK is the power voltage VDD, the anti-noise start circuit 402 turns off the first pull-down circuit (the transistors T12-T15) according to the period signal ECK, and the anti-noise start circuit 404 starts the first pull-down circuit (the transistors T16-T19) according to the period signal ECK to pull down the precharge signal VP1, the precharge signal VP2 and the gate driving signals out(n) and out(n+2) to the anti-noise voltage (the ground voltage). In this way, the anti-noise start circuit 402 and the anti-noise start circuit 404 start the first pull-down circuit and the second pull-down circuit in turns according to the period signal ECK and the period signal EXCK, such that the transistors in the anti-noise start circuit 402, the anti-noise start circuit 404, the first pull-down circuit and the second pull-down circuit are avoided to be biased to the high voltage level to cause reliability reduction of the circuit devices to influence the anti-noise capability of the anti-noise circuit 310.

In summary, in the embodiment of the invention, the isolating switch circuit is configured between two driving circuits of each stage of the driving modules to provide the second precharge signal, so as to effectively avoid a flickering problem of a display image caused by a surge of the gate driving signal due to a coupling effect of a parasitic capacitance of the transistor and a bootstrap capacitor, and since the bootstrap capacitor is not used, the bezel area is effectively reduced. Moreover, the anti-noise circuit may respectively maintain the precharge signals, the gate driving signal of the $N^{th}$ scan line and the gate driving signal of the $(N+2)^{th}$ scan line to the anti-noise voltage according to two period signals with inverted phased during a period when the two driving circuits in each stage of the driving modules stop driving the corresponding scan lines, so as to avoid voltage instability of the output terminals of the gate driving signals due to the floating state thereof.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A gate driving circuit, comprising:
   multistage driving modules, wherein an Nth stage driving module drives an Nth scan line and an (N+2)th scan line of a display panel, wherein N is a positive integer, and the Nth stage driving module comprises:
   a setting circuit, generating a first precharge signal according to a gate driving signal of the (N−2)th scan line or a start signal;
   a first driving circuit, coupled to the setting circuit, generating a gate driving signal of the Nth scan line according to the first precharge signal;
   an isolating switch circuit, coupled to the first driving circuit and a power voltage, and turned on under control of the gate driving signal of the Nth scan line, and outputting the power voltage to serve as a second precharge signal;
   a second driving circuit, coupled to the isolating switch circuit, and generating a gate driving signal of the (N+2)th scan line according to the second precharge signal;
   an anti-noise circuit, coupled to the setting circuit, the isolating switch circuit, the first driving circuit and the second driving circuit, and respectively maintaining the first precharge signal, the second precharge signal, the gate driving signal of the Nth scan line, and the gate driving signal of the (N+2)th scan line to an anti-noise voltage according to a first period signal and a second period signal during a period when the first driving circuit and the second driving circuit stop driving the corresponding scan lines, wherein the anti-noise circuit comprises a control circuit which is coupled to the setting circuit and configured to disable the anti-noise circuit according to the first precharge signal; and
   a reset circuit, coupled to the anti-noise circuit and the first driving circuit, and generating a discharge control signal according to a gate driving signal of an (N+6)th scan line, and the control circuit enables the anti-noise circuit according to the discharge control signal.

2. The gate driving circuit as claimed in claim 1, wherein the anti-noise circuit further comprises:
   a first pull-down circuit, coupled to the setting circuit, the first driving circuit, the isolating switch circuit and the second driving circuit;
   a first anti-noise start circuit, coupled to the first pull-down circuit, and determining whether to start the first pull-down circuit according to the first period signal;
   a second pull-down circuit, coupled to the setting circuit, the first driving circuit, the isolating switch circuit and the second driving circuit; and
   a second anti-noise start circuit, coupled to the second pull-down circuit, and determining whether to start the second pull-down circuit according to the second period signal, wherein the first pull-down circuit and the second pull-down circuit are respectively controlled by the first anti-noise start circuit and the second anti-noise start circuit, and are started in turns to pull down the first precharge signal, the second precharge signal, the gate driving signal of the Nth scan line and the gate driving signal of the (N+2)th scan line to the anti-noise voltage.

3. The gate driving circuit as claimed in claim 2, wherein the first period signal and the second period signal are inverted signals.

4. The gate driving circuit as claimed in claim 3, wherein the first period signal and the second period signal are frequency signals, and a period of the first period signal and the second period signal is equal to 0.5 frame time.

5. The gate driving circuit as claimed in claim 2, wherein the first anti-noise start circuit and the second anti-noise start circuit respectively comprise:
   a first transistor, having a drain and a gate coupled to each other, wherein the drain of the first transistor receives the corresponding period signal, and a source of the first transistor is coupled to the corresponding pull-down circuit; and
   a second transistor, having a drain and a source respectively coupled to the corresponding pull-down circuit and the anti-noise voltage, and a gate of the second transistor receiving the corresponding period signal.

6. The gate driving circuit as claimed in claim 5, wherein the first pull-down circuit and the second pull-down circuit respectively comprise:
   a third transistor, coupled between the setting circuit and the anti-noise voltage, and a gate of the third transistor being coupled to the control circuit and the corresponding anti-noise start circuit;
   a fourth transistor, coupled between the first driving circuit and the anti-noise voltage, and a gate of the fourth transistor being coupled to the control circuit and the corresponding anti-noise start circuit;
   a fifth transistor, coupled between the isolating switch circuit and the anti-noise voltage, and a gate of the fifth transistor being coupled to the control circuit and the corresponding anti-noise start circuit; and
   a sixth transistor, coupled between the second driving circuit and the anti-noise voltage, and a gate of the sixth transistor being coupled to the control circuit and the corresponding anti-noise start circuit, wherein the third transistor to the sixth transistor are respectively controlled by the control circuit, and the corresponding anti-noise start circuit pulls down the first precharge signal, the second precharge signal, the gate driving signal of the Nth scan line and the gate driving signal of the (N+2)th scan line to the anti-noise voltage.

7. The gate driving circuit as claimed in claim 6, wherein the control circuit comprises:
   a seventh transistor, having a drain and a source respectively coupled between the first pull-down circuit and the anti-noise voltage, and a gate of the seventh transistor being coupled to the setting circuit; and an eighth transistor, having a drain and a source respectively coupled between the second pull-down circuit and the anti-noise voltage, and a gate of the eighth transistor being coupled to the reset circuit, wherein the first transistor and the second transistor are turned on under control of the first precharge signal, and are turned off under control of the discharge control signal.

8. The gate driving circuit as claimed in claim 2, wherein the first driving circuit comprises:

a first transistor, having a drain receiving a first frequency signal, a source coupled to the first pull-down circuit and the second pull-down circuit, and a gate coupled to the setting circuit and the reset circuit, wherein the first transistor is turned on under control of the first precharge signal, and is turned off under control of the discharge control signal.

9. The gate driving circuit as claimed in claim 8, wherein the isolating switch circuit comprises:

a second transistor, having a drain coupled to the power voltage, a source coupled to the first pull-down circuit and the second pull-down circuit, and a gate coupled to the source of the first transistor.

10. The gate driving circuit as claimed in claim 9, wherein the second driving circuit comprises:

a third transistor, having a drain thereof receiving a second frequency signal, a source coupled to the first pull-down circuit and the second pull-down circuit, and a gate coupled to the source of the second transistor.

11. The gate driving circuit as claimed in claim 10, wherein a phase difference of the first frequency signal and the second frequency signal is ¼ period.

\* \* \* \* \*